(12) United States Patent
Katz et al.

(10) Patent No.: US 12,494,756 B2
(45) Date of Patent: Dec. 9, 2025

(54) TRAVELING WAVE KINETIC INDUCTANCE PARAMETRIC AMPLIFIER

(71) Applicant: Yissum Research Development Company of the Hebrew University of Jerusalem Ltd., Jerusalem (IL)

(72) Inventors: Nadav Katz, Jerusalem (IL); Samuel Goldstein, Jerusalem (IL)

(73) Assignee: YISSUM RESEARCH DEVELOPMENT COMPANY OF THE HEBREW UNIVERSITY OF JERUSALEM LTD., Jerusalem (IL)

( * ) Notice: Subject to any disclaimer, the term of this patent is extended or adjusted under 35 U.S.C. 154(b) by 1065 days.

(21) Appl. No.: 17/523,546

(22) Filed: Nov. 10, 2021

(65) Prior Publication Data

US 2024/0305256 A1 Sep. 12, 2024

Related U.S. Application Data

(60) Provisional application No. 63/112,230, filed on Nov. 11, 2020.

(51) Int. Cl.
*H03F 7/00* (2006.01)
*H01P 3/08* (2006.01)

(52) U.S. Cl.
CPC ............... *H03F 7/00* (2013.01); *H01P 3/081* (2013.01)

(58) Field of Classification Search
CPC ........................................................ H03F 7/00
USPC ........................................................ 330/4.6
See application file for complete search history.

(56) References Cited

U.S. PATENT DOCUMENTS

| 4,131,858 | A | * | 12/1978 | Niehenke | H03F 7/04 330/56 |
|---|---|---|---|---|---|
| 8,878,626 | B2 | * | 11/2014 | Zmuidzinas | H03F 7/02 333/99 S |
| 10,665,634 | B2 | * | 5/2020 | Zhao | H04N 25/78 |
| 11,271,533 | B2 | * | 3/2022 | Narla | H03F 19/00 |
| 11,879,950 | B2 | * | 1/2024 | Swenson | G01R 33/0094 |
| 12,034,404 | B2 | * | 7/2024 | Berkley | H01P 7/08 |
| 2020/0403137 | A1 | * | 12/2020 | Lampert | H10N 60/12 |

OTHER PUBLICATIONS

P. Krantz, M. Kjaergaard, F. Yan, T. P. Orlando, S. Gustavsson, and W. D. Oliver, "A quantum engineer's guide to superconducting qubits," Applied Physics Reviews 6, 021318 (2019).
L. Ranzani, M. Bal, K. C. Fong, G. Ribeill, X. Wu, J. Long, H.-S. Ku, R. P. Erickson, D. Pappas, and T. A. Ohki, "Kinetic Inductance traveling wave amplifiers for multiplexed qubit readout," Applied Physics Letters 113, 242602 (2018).

(Continued)

*Primary Examiner* — Andrea Lindgren Baltzell
(74) *Attorney, Agent, or Firm* — FisherBroyles, LLP; Roger L. Browdy; James E. Mrose

(57) ABSTRACT

A traveling wave kinetic inductance parametric amplifier is presented. The amplifier includes a microstrip structure defining a parallel plate capacitor element formed by first and second electrically conductive layers spaced by a dielectric spacer layer. The first electrically conductive layer is made of superconducting material composition having desirably high kinetic inductance and being configured as a nanoscale thickness strip.

21 Claims, 4 Drawing Sheets
(4 of 4 Drawing Sheet(s) Filed in Color)

(56) References Cited

OTHER PUBLICATIONS

B. H. Eom, P. K. Day, H. G. LeDuc, and J. Zmuidzinas, "A wideband, low-noise superconducting amplifier with high dynamic range," Nature Physics 8, 623 (2012).
A. Adamyan, S. De Graaf, S. Kubatkin, and A. Danilov, "Superconducting microwave parametric amplifier based on a quasi-fractal slow propagation line," Journal of Applied Physics 119, 083901 (2016).
M. R. Vissers, R. P. Erickson, H.-S. Ku, L. Vale, X. Wu, G. Hilton, and D. P. Pappas, "Low-noise kinetic inductance traveling-wave amplifier using three-wave mixing," Applied physics letters 108, 012601 (2016).
S. Chaudhuri, D. Li, K. Irwin, C. Bockstiegel, J. Hubmayr, J. Ullom, M. Vissers, and J. Gao, "Broadband parametric amplifiers based on nonlinear kinetic inductance artificial transmission lines," Applied Physics Letters 110, 152601 (2017).
N. Kirsh, E. Svetitsky, A. L. Burin, M. Schechter, and N. Katz, "Revealing the nonlinear response of a tunneling two-level system ensemble using coupled modes," Physical Review Materials 1, 012601 (2017).
N. Zobrist, B. H. Eom, P. Day, B. A. Mazin, S. R. Meeker, B. Bumble, H. G. LeDuc, G. Coiffard, P. Szypryt, N. Fruitwala, et al., "Wide-band parametric amplifier readout and resolution of optical microwave kinetic inductance detectors," Applied Physics Letters 115, 042601 (2019).
R. P. Erickson and D. P. Pappas, "Theory of multiwave mixing within the superconducting kinetic-inductance traveling-wave amplifier," Physical Review B 95, 104506 (2017).

\* cited by examiner

TRAVELING WAVE KINETIC INDUCTANCE PARAMETRIC AMPLIFIER

TECHNOLOGICAL FIELD

This invention is in the field of traveling wave parametric amplifiers, and relates to a kinetic inductance type amplifier.

BACKGROUND ART

References considered to be relevant as background to the presently disclosed subject matter are listed below:
1. P. Krantz, M. Kjaergaard, F. Yan, T. P. Orlando, S. Gustavs-son, and W. D. Oliver, "A quantum engineer's guide to superconducting qubits," Applied Physics Reviews 6, 021318 (2019).
2. L. Ranzani, M. Bal, K. C. Fong, G. Ribeill, X. Wu, J. Long, H.-S. Ku, R. P. Erickson, D. Pappas, and T. A. Ohki, "Kinetic inductance traveling-wave amplifiers for multiplexed qubit readout," Applied Physics Letters 113, 242602 (2018).
3. B. H. Eom, P. K. Day, H. G. LeDuc, and J. Zmuidzinas, "A wideband, low-noise superconducting amplifier with high dynamic range," Nature Physics 8, 623 (2012).
4. A. Adamyan, S. De Graaf, S. Kubatkin, and A. Danilov, "Superconducting microwave parametric amplifier based on a quasi-fractal slow propagation line," Journal of Applied Physics 119, 083901 (2016).
5. M. R. Vissers, R. P. Erickson, H.-S. Ku, L. Vale, X. Wu, G. Hilton, and D. P. Pappas, "Low-noise kinetic inductance traveling-wave amplifier using three-wave mixing," Applied physics letters 108, 012601 (2016).
6. S. Chaudhuri, D. Li, K. Irwin, C. Bockstiegel, J. Hubmayr, J. Ullom, M. Vissers, and J. Gao, "Broadband parametric amplifiers based on nonlinear kinetic inductance artificial transmission lines," Applied Physics Letters 110, 152601 (2017).
7. N. Kirsh, E. Svetitsky, A. L. Burin, M. Schechter, and N. Katz, "Revealing the nonlinear response of a tunneling two-level system ensemble using coupled modes," Physical Review Materials 1, 012601 (2017).
8. N. Zobrist, B. H. Eom, P. Day, B. A. Mazin, S. R. Meeker, B. Bumble, H. G. LeDuc, G. Coiffard, P. Szypryt, N. Fruit-wala, et al., "Wide-band parametric amplifier readout and resolution of optical microwave kinetic inductance detectors," Applied Physics Letters 115, 042601 (2019).
9. R. P. Erickson and D. P. Pappas, "Theory of multiwave mixing within the superconducting kinetic-inductance traveling-wave amplifier," Physical Review B 95, 104506 (2017).

Acknowledgement of the above references herein is not to be inferred as meaning that these are in any way relevant to the patentability of the presently disclosed subject matter.

BACKGROUND

The rapid advance of the last few years in the field of superconducting qubits has led to a demand for reliable cryogenic micro-wave amplifiers, characterized by low noise and large bandwidth. Travelling-wave parametric amplifiers present a solution with two leading implementations: 1) Josephson Travelling-Wave Parametric Amplifiers (JTWPA), that employ the Josephson Junction's nonlinear (tunable) inductance to yield a nonlinear wave-equation and wave-mixing, and 2) Kinetic Inductance Travelling-Wave Amplifiers (KITWA), which exploit the high nonlinear kinetic inductance of certain materials (e.g. NbTiN or NbN).

Devices of both implementations share the challenge of matching their impedance to the 50Ω of conventional high-bandwidth electronics. Boosting the inductance increases the impedance by up to an order of magnitude but causes ripples in the transmission spectrum. Various attempts to cope with this issue include adiabatic tapers at the beginning and end of the amplifier, shunting the transmission line by fractal structures, and by multiple resonators to lower the impedance.

While the various attempts to match the impedance partially succeed, they suffer from certain disadvantages: Adiabatic tapers prolong the wave guide notably and despite the effort, ripples appear in the transmission spectrum. The JTWPA's primary problem is a lower dynamic range, and it too sometimes fails in fully matching the impedance of the external electronics. The fractal structure is sensitive to fabrication errors and spurious ground plane resonances, requiring wire bonds across the trace.

U.S. Pat. No. 8,878,626 discloses a traveling wave kinetic inductance parametric amplifier including a superconducting transmission line configured as a coplanar waveguide and a dispersion control element. The transmission line includes periodic variations of its dimensions along its length. Superconductor materials with a high normal state resistivity are used. Nitrogen is used as the high normal state resistivity material and the metal is selected from the group consisting of titanium, niobium, and vanadium. The traveling wave kinetic inductance parametric amplifier is expected to exhibit a noise temperature below 100 mK/GHz.

GENERAL DESCRIPTION

There is a need in the art for a novel approach for configuring traveling wave kinetic inductance parametric amplifiers, while meeting the impedance matching requirements (e.g. 50 Ohm) and the performance requirements, and providing for simplifying the manufacture of the amplifier and making it desirably small (short-length transmission line).

The present invention provides an impedance-matched traveling wave parametric amplifier (TWPA), which utilizes a transmission line formed by a microstrip structure configured to provide the desired performance of the amplifier (e.g. a wide bandwidth, large dynamic range, and a sub-Kelvin noise temperature, which features are especially beneficial for superconducting circuit readout protocols) and enable the desirable short length thereof.

According to one broad aspect of the invention, it provides a traveling wave kinetic inductance parametric amplifier comprising: a microstrip structure defining a parallel plate capacitor element formed by first and second electrically conductive layers spaced by a dielectric spacer layer, the first electrically conductive layer being made of superconducting material composition having desirably high kinetic inductance and being configured as a nanoscale thickness strip.

The capacitor element is configured with desirably high capacitance per unit length of the superconducting strip, thereby providing the desired impedance matching of microstrip structure (typically to 50 Ohm).

Preferably, the technique of the present invention derives the nonlinearity from tungsten-silicide's highly power-dependent kinetic inductance. Instead of Nb alloys commonly used in Josephson junction type and coplanar waveguide types parametric amplifiers, the present invention utilizes a nanometric layer (in thickness) of high kinetic inductance materials, such as amorphous tungsten-silicide, WSi, whose kinetic inductance is sufficiently large, allowing to neglect their magnetic inductance effects.

In order to meet the 50 Ohm impedance requirements while using such high kinetic inductance superconducting element (for the purposes of high performance), capacitance of the amplifier structure is to be significantly increased. The microstrip transmission line configuration enables this to be achieved/controlled by properly selecting the geometrical features/parameters of the structure. It should be understood that a significant outcome of increasing the capacitance (capacitance per unit length) $C_l$ is a drop in the phase velocity $v_{ph}=1/((L_l C_l)^{1/2})$ permitting to shorten the amplifier by an order of magnitude, while still obtaining appreciable amplification.

Preferably, the microstrip structure of the invention is configured and operable as an electrical transmission line having a phase velocity substantially not exceeding 0.005c, c being speed of light in vacuum Preferably, the nanoscale-thickness superconducting strip has kinetic inductance per unit length of the strip of at least 50 µH/m and the capacitor element is configured with capacitance per unit length of at least 20 nF/m, thereby providing impedance of the microstrip structure matching 50 Ohm.

The microstrip configuration of the invention provides for using the superconducting strip with a few centimeters' length, e.g. substantially not exceeding 10 cm.

Preferably, the nanoscale-thickness strip has a pattern of width variation along the strip.

As indicated above, the superconducting material composition preferably comprises amorphous tungsten-silicide (WSi).

The dielectric spacer layer is preferably made of amorphous silicon; and the second electrically conductive layer (grounded layer) may be aluminum.

As indicated above, the superconducting strip is very thin (nanoscale thickness). The strip has a width-thickness aspect ratio of an order of 1000. Typically, the thickness is of a few nanometers and an average width of the strip is of several microns.

According to another broad aspect of the invention, it provides a traveling wave kinetic inductance parametric amplifier comprising: a microstrip structure defining a capacitor element formed by first and second electrically conductive layers spaced by a dielectric spacer layer, the first electrically conductive layer being made of superconducting material composition having desirably high kinetic inductance and is configured as a nanoscale thickness strip having a pattern of strip width variation, said capacitor element being configured with desirably high capacitance per unit length of said strip providing impedance of said microstrip structure matching 50 Ohm.

According to yet another broad aspect of the invention, it provides a traveling wave kinetic inductance parametric amplifier comprising: a microstrip structure defining a capacitor element formed by first and second electrically conductive layers spaced by a dielectric spacer layer, the first electrically conductive layer being made of superconducting material composition having desirably high kinetic inductance and said capacitor element being configured with desirably high capacitance per unit length of said strip, thereby providing impedance of said microstrip structure matching 50 Ohm at a length of said strip substantially not exceeding 10 cm.

The invention also provides a traveling wave kinetic inductance parametric amplifier comprising: a microstrip structure defining a parallel plate capacitor element formed by first and second electrically conductive layers spaced by a dielectric spacer layer, the first electrically conductive layer being made of superconducting material composition of WSi having desirably high kinetic inductance and being configured as a nanoscale thickness strip, and said dielectric spacer layer being a silicon layer.

BRIEF DESCRIPTION OF THE DRAWINGS

The patent or application file contains at least one drawing executed in color. Copies of this patent or patent application publication with color drawings will be provided by the Office upon request and payment of the necessary fee.

In order to better understand the subject matter that is disclosed herein and to exemplify how it may be carried out in practice, embodiments will now be described, by way of non-limiting example only, with reference to the accompanying drawings, in which:

FIG. 1B shows a graphic illustration of the layers, and FIG. 1C shows a SEM image of launch pad with all layers visible.

FIGS. 3A-3B shows the nonlinearity in single tone measurements with the traveling wave kinetic inductance parametric amplifier device of the present invention, wherein FIG. 3A depicts the magnitude of measured signal transmission, as the input power is altered. Insert: Simulation, accounting also for loss saturation according to the standard TLS model, and FIG. 3B shows the unwrapped nonlinear phase of measured signal, referenced to the lowest power and to the individual power level's phase at 3 GHz. Insert: Linear phase, relative to lowest measured frequency.

FIGS. 4A-4B show results of two-tone experiments which demonstrate the parametric amplification and wave-mixing in the traveling wave kinetic inductance parametric amplifier device of the present invention, wherein FIG. 4A shows the pump amplification factor, $G_p$, for a signal at various $f_s$ (at 95 dBm) when the power of pump at $f_p=4.95$ GHz is increased. Insert: Simulations for pump powers 47 dBm (red), 50 dBm (orange), 53 dBm (lime), and 56 dBm (turquoise) show consistent amplitude and bandwidth of $G_p$ as in experiment; and FIG. 4B shows idler conversion efficiency measured at $f_i=2f_p-f_s$. Insert: Simulation with color map as in FIG. 4A.

FIGS. 5A-5B show results of simulations that confirm the impact of reducing the phase velocity on the amplification, wherein FIG. 5A depicts the amplification (in dB) for a −42 dBm pump at f=4.95 GHz and a signal of −101 dBm, neglecting loss effects; and FIG. 5B shows the signal gain ratio $G_s(\gamma k z)^2+1$ times the power loss factor $L=e^{-2\Gamma_s^0 z}$, simulated without saturation effects for $f_s=5$ GHz (with $\gamma=(I/I_x)^2=0.1$);

FIGS. 9A-9C show results obtained with the traveling wave kinetic inductance parametric amplifier of the present invention operated in a mode of three-wave mixing, wherein FIG. 9A shows the power gain (output/input) of signal when pump powers and DC biases intensify; FIG. 9B shows the rise of the idler poser as a function of pump power; and FIG. 9C shows the gain at constant pump power with increasing DC bias.

DETAILED DESCRIPTION OF EMBODIMENTS

Figures 1A, 1B, 1C:
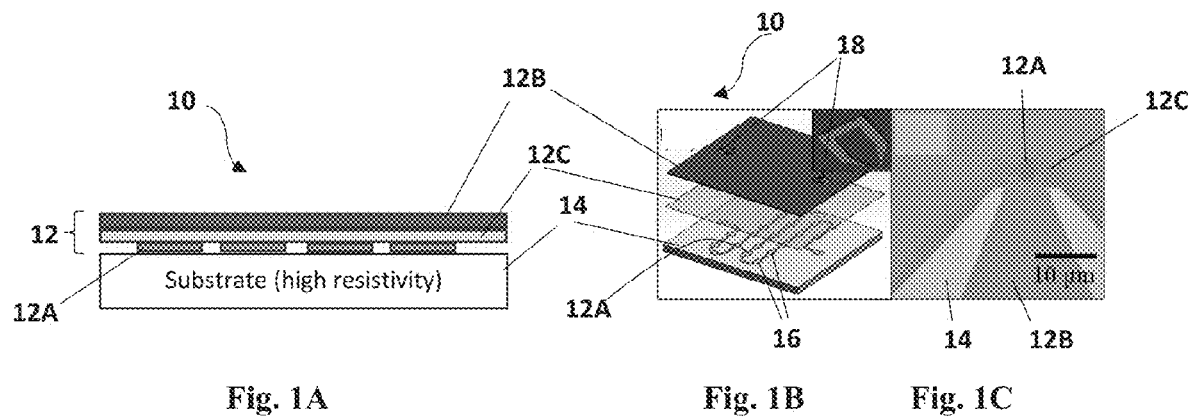
FIG. 1A is a schematic illustration of the configuration of traveling wave kinetic inductance parametric amplifier device of the present invention utilizing a microstrip structure.
FIG. 1B-1C exemplify the layout and fabrication of the microstrip structure used in the device of FIG. 1A, where

Referring to FIGS. 1A-1C, there is schematically illustrated a traveling wave kinetic inductance parametric amplifier (TWPA) 10 of the present invention. The TWPA 10 includes a microstrip structure defining a parallel plate capacitor element 12, which is located on a substrate 14 (high resistivity layer, e.g. Si). The capacitor element 12 is formed by first and second electrically conductive layers 12A and 12B spaced by a dielectric spacer layer 12C. The first electrically conductive layer 12A is made of superconducting material composition having desirably high kinetic inductance $L_{kin}$ and is configured as a nanoscale thickness strip.

FIG. 1B shows a graphic illustration of the layers (on the bulk Si substrate, the WSi is patterned, followed by the dielectric spacer layer, and finally covered by the Al ground layer). The insert shows launch pad for bonding with isolation from ground. FIG. 1C shows a SEM image of launch pad with all layers visible.

In some non-limiting examples, the layer 12A is a long trace (generally, a few centimeters length, e.g. 10-12 cm) of highly inductive tungsten-silicide (WSi). This strip 12A of the superconductive material composition preferably has a high width-thickness aspect ratio, of an order of 1000, e.g., has a thickness of a few nanometers and has a width (average width) of several microns along the strip.

For example, in the experiments conducted by the inventors, the strip 12A of 11.6 cm length with a cross section of 2 μm×5 nm was used, as well as the strips of some other dimensions. Such a strip was created by DC-magnetron sputtering of WSi target (55%/45%) directly onto the high-resistivity Si substrate 14.

The nanometric layer of e.g. WSi, whose kinetic inductance is sufficiently large (about 50 μH/m or higher), allows to neglect the magnetic inductance. This layer 12A is patterned by any known suitable technique (e.g. optical lithography) to form a desired shape of the strip, e.g. zig-zag like shape in order to even more decrease the dimensions of the entire structure.

As also shown in FIG. 1B, the strip 12A of the superconductive material composition has a pattern of strip width variation, e.g. periodic perturbations 16.

It should be understood that all the layers of the microstrip structure 10 may, if needed, be appropriately patterned using any known suitable technique, and defined by selective wet-etch to form large pads at both ends of the trace 12 and periodic perturbations 16.

It should also be noted that the use of strip width variations, e.g. periodic perturbations, provides for variation of its impedance to thereby create stop-bands in the spectrum of a transmission line, which also serves to restrain shock wave generation. This is particularly useful during wave-mixing, in that it allows the control of phase matching of the wave numbers, $k_s$, $k_p$, and $k_i$, corresponding to the three current tones, the signal, the pump, and the idler.

The material for dielectric layer spacer 12C is chosen according to the following two properties: its loss tangent tan δ (to minimize dielectric loss) and permittivity $\varepsilon_r$ which, together with the thickness of this layer is selected in order to provide desirably high capacitance (capacitance per unit length, $C_l$,), keeping in mind the desirably high kinetic inductance of superconducting layer 12A.

For example, the dielectric spacer layer may be evaporated amorphous Si, as its tan δ is about $5\times10^{-4}$, while $\varepsilon_r$ is close to well-known values of $\varepsilon_r^{Si}$ (depends weakly on morphology). The amorphous Si film can be made a few nanometers thicker than the superconducting layer 12A (e.g. WSi) to ensure step coverage (i.e. physical contact between film domains above the WSi and next to it), and engineered to match 50Ω.

It should be noted that in this lithographic step Si is removed only from the WSi launchers 18 where metal in the next step enhances galvanic contact between wire-bonds and WSi pads. FIG. 1C shows a false-colored SEM image of the launcher pad of the TWPA showing second electrically conductive layer (aluminum) 12B, dielectric spacer layer (amorphous silicon) 12C, first electrically conductive layer (superconducting layer) 12A, e.g. WSi, and substrate (silicon) 14.

The second electrically conductive layer (metal) 12B may be evaporated Al, which serves as the ground layer. This step of the structure fabrication is the last lithography step during which the launch pads 18 are formed.

It should be understood that using a parallel (top) ground plate 12B covering most of the structure (chip) ensures a common global ground, as opposed to the separated ground electrodes of co-planar wave guides, cut by the trace. Also, such ground plate protects the trace 12A from scratches during the subsequent handling and packaging.

It is to be noted that the TWPA device of the present invention provides capacitance C, resembling that of a parallel plate capacitor with the thickness of a few nanometers, and can be engineered rather easily to 50Ω. This is an essential and advantageous difference from known in the art implementations of kinetic inductance TWPAs which are typically coplanar waveguides with micronic gaps to the surrounding ground plates, presenting a challenge to match their impedance $Z=(L_l C_l)^{1/2}$ (where $L_l$ and $C_l$ are the inductance and capacitance per unit length) to the 50Ω of conventional high-bandwidth electronics.

Generally, boosted inductance $L_l$ increases the impedance Z by up to an order of magnitude causing ripples in the transmission spectrum [6]. Various attempts to cope with this issue include adiabatic tapers at the beginning and end of the amplifier, shunting the transmission line by fractal structures [4], and by multiple resonators to lower the impedance Z.

It should be noted that a significant outcome of increasing the capacitance per unit length $C_l$ is a drop in the phase velocity $v_{ph}=1/((L_l C_l)^{1/2})$ enabling to shorten the amplifier by an order of magnitude, while still obtaining appreciable amplification.

In the experimental TWPA device fabricated by the inventors, WSi was used as superconducting layer 12A having kinetic inductance per unit length, $L_k$, of about 50 μH/m. In order to properly measure this parameter, the inventors fabricated, in a separate experiment, a superconducting coplanar wave-guide resonators with relevant cross section (i.e. which was selected to be used in the microstrip, i.e. 2 μm×5 nm). For the kinetic inductance per unit length of 50 μH/m, a capacitance per unit length, $C_l$, of about 20 nF m is to be used to match the TWPA's impedance to 50Ω. These high values of $C_l$ and $L_l$ predict a phase velocity, $v_{ph}$, of −0.004c, where c is the speed of light in vacuum.

It should be understood that the microstrip structure of the invention provides for obtaining such reduced phase velocity resulting in the effective length of the superconducting strip of a 11.6 cm, which corresponds to 8.7 m of an equivalent coplanar waveguide having much higher phase velocity, i.e. $v_{ph}$=0.3c.

The maximum achievable parametric gain G is linked to the nonlinearity of the transmission line:

$$G \approx \exp(\Delta\theta)/4$$

where $\Delta\theta=(\theta/2)(I/I_x)^2$ is the additional phase shift acquired by the signal in response to a current I through the transmission line due to the non-linearity (I. is the nonlinearity parameter).

The nonlinear phase shift $\Delta\theta$ is proportional to the electrical length (total input-output phase shift acquired by small signal):

$$\theta = 2\pi z_{tot} f_s / v_{ph}$$

where $z_{tot}$ is the total physical length of the line, $f_s$ is the microwave frequency and $v_{ph}$ is the phase velocity. In typical coplanar waveguides, due to the higher phase velocity $v_{ph}$, lines of several meters long are required to achieve 10 dB average gain.

Even through a short trace (e.g. 11.6 cm) used in the microstrip structure of the present invention the transmitted tones can accumulate a significant nonlinear phase sufficient for wave-mixing, and the TWPA can then be much shorter than previous implementations [3].

Moreover, simulations performed by the inventors have shown that lower phase velocity $v_{ph}$ enhances the amplification (while narrowing the operational bandwidth).

The nonlinear inductance is scaled by a current I. (comparable to the critical current of the trace) by [3]:

$$L_{kin} = L_0(1 + (I/I_*)^2) \quad (1)$$

wherein $L_0$ is the geometrical inductance.

The power dependence of kinetic inductance $L_{kin}$ leads to a power-dependent wave equation, which will be solved below, in connection with the amplification process within the structure, e.g. three-wave or four-wave mixing. In the description below, the four-wave technique is demonstrated, but this does not limit the principles of the present invention. method used in the present invention.

Under the undepleted pump assumption, $|I_p|>>|I_s|, |I_i|$, the analytical solution for pump signal $I_p$ is [3]:

$$I_p(z) = I_p(0)\exp(i(k_p z - wt) + ik_p z \gamma) \quad (2)$$

where z is the wave propagation axis (i.e. length of the device); $k_p=f_p/v_{ph}$ is the pump's wave number; and $\gamma=|I_p(0)|^2/2|I_*|^2$, i.e., in addition to the ordinary linear phase (inner brackets in exponent of Eq. 2), the current also accumulates a nonlinear phase shift, $k_p z \gamma$.

The established formalism of nonlinear optics will be applied in the following to simulate the performance of the kinetic inductance TWPA of the current invention. The propagating current is described as a linear combination of pump, signal, and idler tones ($I_p$, $I_s$, and $I_i$):

$$I = \frac{1}{2}\sum_{n=s,p,i} I_n(z) e^{(i(k_n z - w_n t))} + c.c. \quad (3)$$

where other wave-mixing processes [9] than four wave-mixing with $2f_p=f_s+f_i$ are ignored. The ansatz of Eq (3) is now used to solve the nonlinear wave equation:

$$\frac{\partial^2 I}{\partial z^2} = \frac{d}{dt}\left(\frac{1}{(v_{ph}(I))^2}\frac{dI}{dt}\right) \quad (4)$$

The nonlinearity of phase velocity $v_{ph}$ stems from the power-dependent inductance (see Eq (1)), and leads to the coupled equations, which under the undepleted pump assumption ($I_p>>I_s, I_i$) take the form $$\frac{dI_p}{dz} = \frac{ik_p}{2I_*^2}|I_p|^2 I_p - \Gamma_p I_p \quad (5a)$$

$$\frac{dI_p}{dz} = \frac{ik_s}{2I_*^2}(|I_s|^2 I_p + I_i^* I_p^2 e^{i\delta k z}) - \Gamma_s I_s \quad (5b)$$

$$\frac{dI_p}{dz} = \frac{ik_i}{2I_*^2}(|I_i|^2 I_p + I_s^* I_p^2 e^{i\delta k z}) - \Gamma_i I_i \quad (5c)$$

Here $\delta k = 2k_p - k_s - k_i$ is the mismatch between the wave numbers of the above three current tones, and the kinetic inductance ratio is neglected, since it is close to unity for WSi. The kinetic inductance ratio α is the kinetic inductance divided by the total inductance:

$$\alpha = \frac{L_{kin}}{L_{tot}} = \frac{L_{kin}}{L_{kin} + L_{mag}}$$

where $L_{kin}$ is the kinetic inductance and $L_{mag}$ is the magnetic inductance. Since the kinetic inductance dominates the total inductance $L_{tot}$, the kinetic inductance ratio α is close to unity. Therefore, in equations 5(a)-5(c) above, the kinetic inductance ratio α was omitted and does not multiply $I_*^2$.

Loss due to the dielectric material, expressed through the self-loss coefficient, is included:

$$\Gamma_p = \frac{2\pi f_p}{v_{ph}} \frac{1}{2} \frac{\tan\delta_0}{\sqrt{(1+\Omega_{Rabi}^2 T_1 T_2)}} \quad (6)$$

where $\Omega_{Rabi}$ is the Rabi frequency of the two-level-systems in the standard two-level-system (TLS) model [7], tan $\delta_0$ is the loss tangent (without saturation effects), and $T_1$ and $T_2$ are the decay and dephasing times [7]. Specifically, $\Omega_{Rabi}$=2d·E/ℏ, where E is the electric field, d is the dipole moment (in the simulations reported here, d=1 Db). For both $T_1$ and $T_2$ the value 100 ns is used.

In the TLS model, losses are due to absorption of energy by TLSs. At high pump powers the TLSs become saturated, and the energy absorption subsequently is decreased. The square-root in the denominator of Eq. (6) accounts for absorption of a pump at $f_p$ not only by TLSs at the same frequency, but also those slightly detuned.

When turning to two-tone measurements (with a strong pump at $f_p$ and a weaker signal at $f_s \neq f_p$), the inventors have found that saturation effects are only caused by the pump, and that the absorption of the signal tone is linear. The signal loss is thus a function of the probability that TLSs at $f_s$ are excited by the signal itself rather than by the pump. This probability is approximated by means of the saturation parameter of TLSs at $f_s$, when the pump is at $f_p$:

$$s = \frac{\Omega_{Rabi}^2 T_1 T_2}{1+(\delta f)^2 T_2^2}$$

where $\delta_f = f_p - f_{TLS}$ (in this case $f_{TLS} = f_s$), and $\Omega_{Rabi}$ is the Rabi frequency of the pump.

The excited population Pee of the TLSs due to the pump is subsequently $$\rho_{ee} = \frac{s}{2(1+s)}.$$

Thus, a pump-dependent decay constant is written both for the signal and for the idler as:

$$\Gamma_{s,i} = \Gamma_{s,i}^0 (1 - 2\rho_{ee})$$

With $$\Gamma_{s,i}^0 = \frac{1}{2} \frac{2\pi f_{si}}{v_{ph}} \tan\delta_0$$

being the linear decay constant, referring to the linear loss of the signal (idler) only, as if no pump were present.

Figures 3A, 3B:
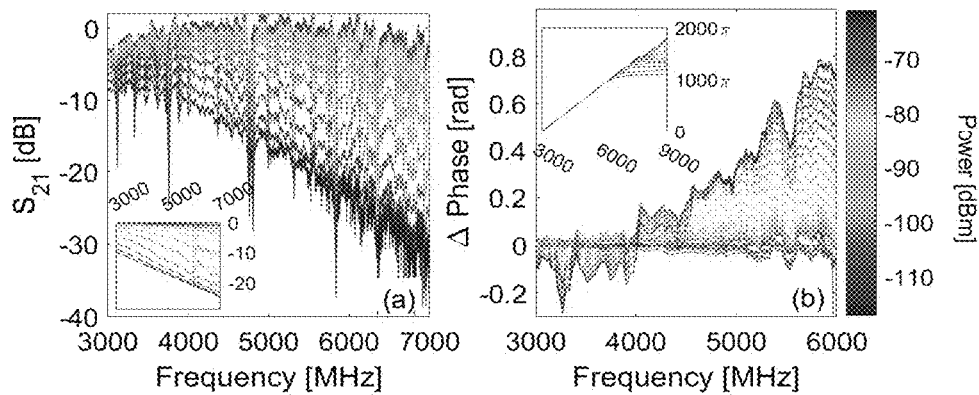

The analytic solution for the pump (Eq. 5(a)) is:

$$I_p(z) = I_p(0) e^{ikpz\frac{|I_p(0)|^2}{2I_*^2} - \Gamma_p z}$$

as shown in FIG. 3B and referred to below.

In the following, the theoretical simulations will be confirmed by experimental measurement with the TWPA of the present invention. All experiments were performed at temperature 20 mK.

Figure 2:
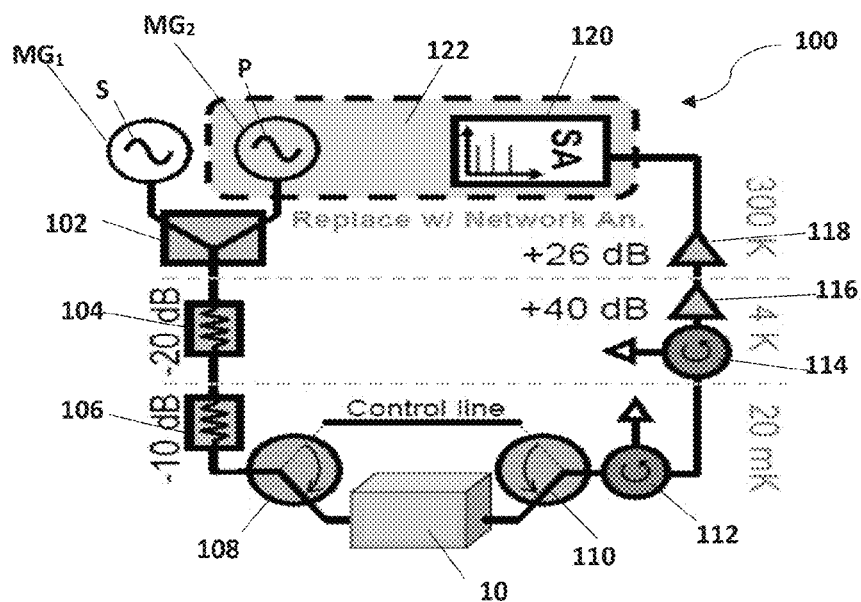
FIG. 2 shows the experimental setup used to measure the gain and noise of the traveling wave kinetic inductance parametric amplifier device of the present invention.

Referring to FIG. 2, a measurement system 100 is exemplified. As shown, signal S and pump P are generated in two MG3692B microwave generators $MG_1$ and $MG_2$, merged in a power combiner 102 at room temperature (300K), and successively passed through microwave attenuators 104 and 106. For calibration, the TWPA device 10 of the present invention is connected in parallel with a control line through cold switches 108 and 110 on both sides of the device 10. The output successively passes through circulators 112 and 114 to avoid reflections. Conventional amplifiers 116 and 118 are placed at 4K (HEMT) and $T_{room}$ (LNA 2-8 GHz), respectively, before readout in an EXA N9010A spectrum analyzer 120. In experiments without idler-measurements, the spectrum analyzer 120 and microwave generator $MG_2$ are replaced with an N5230A vector network analyzer 122.

Prior to amplification measurements, the performance of the device 10 of the present invention was demonstrated with linear and non-linear single-tone characterization. Initially, phase velocity $v_{ph}$ was estimated by broadcasting a pulse through the TWPA 10, and in a different measurement, through a parallel control channel. The delay in arrival (not shown) was compared, and a phase velocity, $v_{ph}$, that was thus found, appeared to be consistent with the theoretical expectation. In a separate measurement the critical current $I_c$ of the WSi trace was determined to be about 0.06 mA.

Reference is now made to FIGS. 3A and 3B illustrating the nonlinearity in single tone measurements with the traveling wave kinetic inductance parametric amplifier device of the present invention.

FIG. 3A depicts the nonlinear magnitude of measured signal transmission, as the input power is altered. Insert: Simulation, accounting also for loss saturation according to the standard TLS model. The power-dependent loss can be associated with saturation of two-level systems (TLSs) [7] and is consistent with ab initio simulations described above. These predict stronger amplification with only moderate improvements, such as higher nonlinearity (i.e., lowering $I_c$).

FIG. 3B shows the unwrapped nonlinear phase of measured signal, referenced to the lowest power and to the individual power level's phase at 3 GHz. Insert shows linear phase, relative to lowest measured frequency. The figure displays the nonlinear length-dependent phase accumulated through the device 10, allowing wave-mixing and amplification (refer to Eq. (2)). This phase is to be considered in light of the linear phase accumulation of ~$10^3$ radians (insert). The linear increase of the slope of the nonlinear phase as a function of pump power follows Eq (2) (here shown up to 6 GHz beyond which losses make the extraction difficult at low power).

In the next, two-tone experiments using TWPA device 10 of the present invention, where wave-mixing between a low-powered signal at frequency $f_s$ and a high-powered pump at $f_p$ amplifies the former and produces an idler tone at f will be described. By initially changing $f_p$ and measuring the average amplification of the signal over a range $f_p \pm 1$ GHz, $f_p$=4.95 GHz was chosen for subsequent experiments.

Figures 4A, 4B:
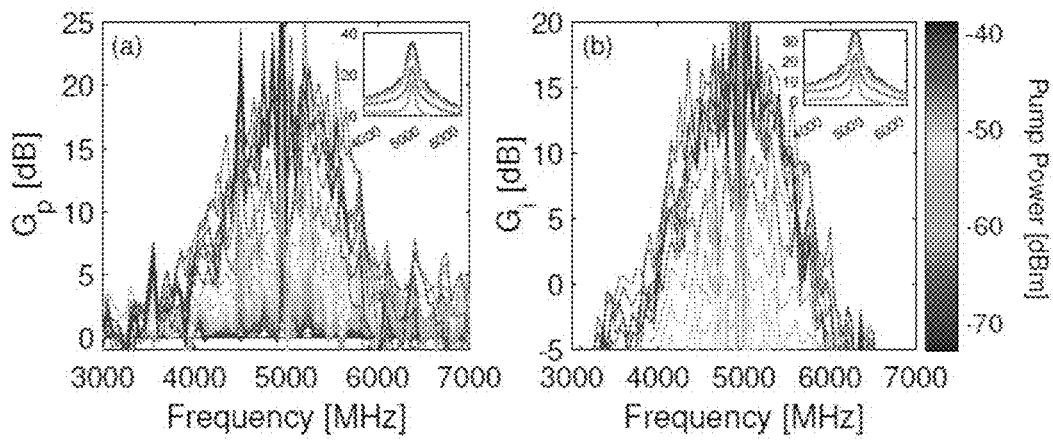

In this connection, reference is made to FIGS. 4A and 4B showing the results of two-tone experiments which demonstrate the parametric amplification and wave-mixing in the traveling wave kinetic inductance parametric amplifier device of the present invention.

The idler tone emerging at $f_i = 2f_p - f_s$ is measured as $f_p$ and is kept constant at various powers, and the signal power is kept constant for changing $f_s$.

FIG. 4A shows the pump amplification factor, $G_p$, for a signal at various $f_s$ (at 95 dBm) when the power of pump at $f_p$=4.95 GHz is increased. Insert: Simulations for pump powers 47 dBm (red), 50 dBm (orange), 53 dBm (lime), and 56 dBm (turquoise) show consistent amplitude and bandwidth of $G_p$ as in experiment. The pump amplification factor is determined as:

$$G_p = \frac{|I_s^{pump}|^2}{|I_s^0|^2} \quad (7)$$

where $I_s^{pump}$ is the measured output current at $f_s$ with the pump, and $I_s^0$ is the measured output current at $f_s$ without the pump.

FIG. 4B shows idler conversion efficiency measured at $f_i=2f_p-f_s$. Insert: Simulation with color map as in FIG. 4A. In the figure, the idler conversion efficiency, i.e., the ratio between the measured idler and the signal input is plotted:

$$G_i = \frac{|I_i^{out}|^2}{|I_i^{in}|^2} \quad (8)$$

These matrices are chosen instead of the more commonly used signal gain $G_s=|I^{out}|^2/|I^{in}|^2$ as they emphasize the nonlinearity of the TWPA and the wave-mixing in it, respectively. The strong idler (FIG. 4B) confirms the wave-mixing taking place in the TWPA device of the present invention.

Theoretical estimates of the amplification were performed by initial simulation Eq (5a) to find the nonlinear transmission spectrum (insert in FIG. 3A) and the power-dependent $\Omega_{Rabi}$ of the pump throughout the TWPA device. Subsequently, Eq (5b) and Eq (5c) were solved numerically and the resulting signal gain $G_p$ for different pump powers is shown in the insert of FIG. 4A. Simulation results shown in FIG. 4A were obtained by calculating, first, the theoretically expected amplification when injecting a signal at a fixed pump power with changing frequency. Then, simulations were performed while changing pump power and keeping the frequency injected into the amplifier fixed.

Figures 5A, 5B:
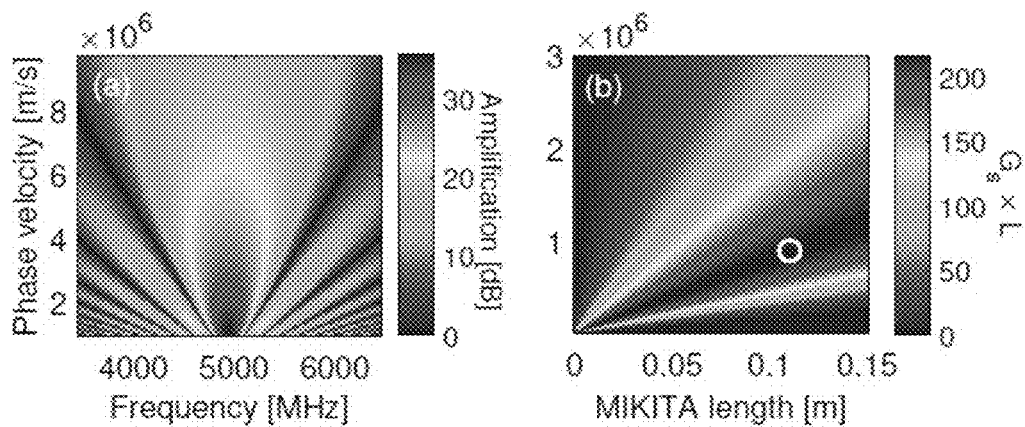

As mentioned above, simulations performed by the inventors indicate that lower phase velocity $v_{ph}$ enhances the amplification (while narrowing the operational bandwidth). Reference is made to FIGS. 5A-5B showing the simulation results that confirm the impact of reducing the phase velocity on the amplification.

FIG. 5A visualizes how the amplification increases with decreasing the phase velocity $v_{ph}$, while the bandwidth is reduced. This figure depicts the amplification (in dB) for a $-42$ dBm pump at f=4.95 GHz and a signal of $-101$ dBm, neglecting loss effects.

FIG. 5B shows the signal gain ratio: $G_s(\gamma kz)^2+1$ times the power loss factor $L=e^{-2\Gamma_s^0 z}$, simulated without saturation effects for $f_s$=5 GHz (with $\gamma=(I/I_x)^2$=0.1). As shown in this figure, when expanding the length z of the TWPA device (i.e. length of superconducting strip 12A), the loss intensifies as expressed by the loss factor $L=e^{-2\Gamma_s^0 z}$ (note the factor of 2, as this is power decay). Here, again, saturation effects are ignored. It should also be noted that the signal gain $G_s=(\gamma kz)^2$ depends on both the length and the phase velocity, and the product $G_s \times L$ thus predicts for which set of these parameters, $(v_{ph}, z)$, the highest amplification is accessible, as shown in FIG. 5B. The white circle in FIG. 5B indicates the working parameters used with the TWPA device 10 of the present invention: z=11.6 cm and $v_{ph}$=0.003c=9×10$^5$ m/s. It should be noted that the theoretical amplification is a few dB higher than what was found empirically by the inventors, even after loss effects were considered. This discrepancy is likely to rest on the simulation's sensitivity to parameters such as tan δ and $I_x$.

Figure 6:
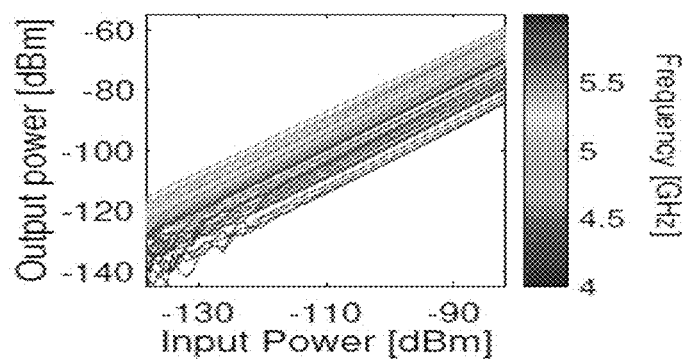
FIG. 6 shows the measured dynamic range of traveling wave kinetic inductance parametric amplifier of the present invention: the amplification factor $G_p$ is nearly constant for various $f_s$ values, when the signal power is increased from −139 dBm over four orders of magnitude and the pump power (−42 dBm) is kept constant at $f_p$=4.95 GHz.

One of the essential properties of the amplifier device of the present invention is its large dynamic range. Reference is made to FIG. 6 showing the measured dynamic range of TWPA of the present invention. The transmission of the signal is nearly linear, i.e., the amplification factor $G_p$ is nearly constant for various signal frequency values $f_s$, as the power increases by more than four orders of magnitude from $-139$ dBm (below the single-photon equivalent power level), while a pump power at $f_p$=4.95 GHz is kept constant at $-42$ dBm.

Turning back to FIG. 2, the amplifier device of the present invention is the first component in a cascade of amplifiers (and effective attenuators), and its noise temperature is found by solving the recursive equations for $N_{in}$ and $N_{out}$, the input and output noise of the components from the TWPA and up through the line, respectively. Each component is treated also as an amplifier, in which case $$N_{in} = \frac{N_{out}}{G_s} - k_B T_{eff} B \quad (9)$$

where B is the bandwidth (91 Hz in all the measurements conducted by the inventors), and $T_{eff}$ is the effective noise temperature, related to the noise figure NF:

$$NF = 10\log 10(1 + T_{eff}/T_0)$$

where $T_0$ is the physical temperature. $\tilde{G}_s$ is the signal gain ratio (e.g., $G_s$=20 dB⇒$\tilde{G}_s$=100).

Attenuators have input noise:

$$N_{in} = \frac{N_{out} + (\tilde{G}_s - 1)k_B TB}{\tilde{G}_s} \quad (10)$$

where $\tilde{G}_s$ still denotes the gain (0<$\tilde{G}_s$<1 for attenuators) analogue to the case of amplifiers.

Figure 7:
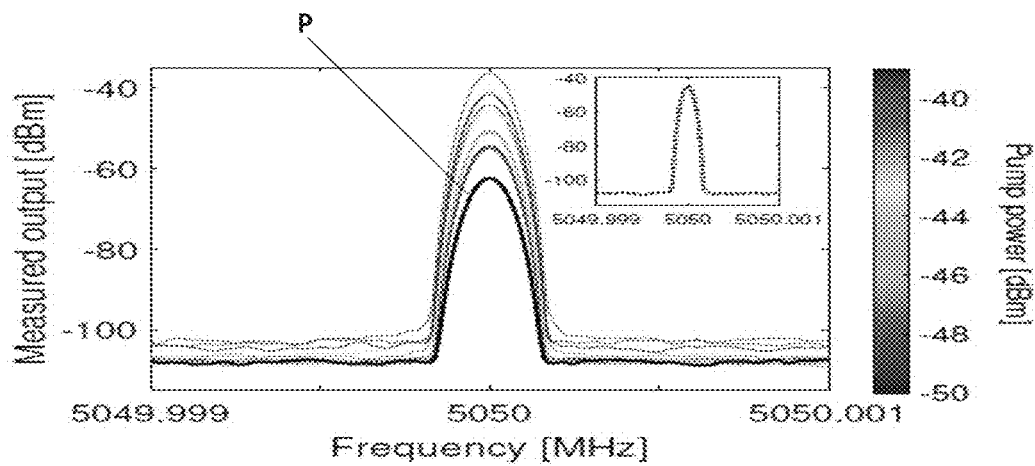
FIG. 7 depicts the noise characterization of the traveling wave kinetic inductance parametric amplifier of the present invention. Signal output as measured after the cascade of switch, circulators, and commercial cryogenic amplifiers, as it appears in FIG. 2A, when the signal generator emits a tone of −50 dBm detuned by 100 MHz from the pump at $f_p$=4950 MHz. Black line: Signal transmitted without pump. Insert: Measurement through the control line (where variation of the pump power did not affect the transmission by more than 1 dB, thus allowing the plotting for the case of no pump only)

FIG. 7 shows the noise characterization of the TWPA device 10 of the present invention. Signal output as measured after the cascade of switch, circulators, and commercial cryogenic amplifiers (FIG. 2), when the signal generator emits a tone of $-50$ dBm detuned by 100 MHz from the pump at $f_p$=4950 MHz. Graph P corresponds to signal transmitted without pump. Insert: Measurement through the control line (where variation of the pump power did not affect the transmission by more than 1 dB, thus allowing the plotting for the case of no pump only).

The signal gain ratio $G_s$ of the TWPA device is determined by comparing the measured output in the case of the highest transmission on FIG. 7 with that from the control line, and hereafter the base line or noise floor, $-108$ dBm, is adopted as the noise output at the end of the cascade (FIG. 2). Rigorously solving for each component in the chain, including cable loss (treated as attenuation), sets the noise temperature of the TWPA device to be 0.3K<$T_{eff}$<0.61K. The uncertainty results from an additional loss of 3-4 dB in the line measured are associated with localized components in the cascade (leaving the temperature and position of these sources of loss in the line uncertain).

The SNR of the measurement line with the TWPA device can be read from FIG. 7 to be 5 dB higher than the SNR of the control line in the insert of the same figure.

Assuming that the above estimation of the TWPA's noise temperature is conservative, it is evident that there is a possibility of reaching the quantum noise limit with the TWPA device of the present invention by moderate improvement of the dielectric loss tangent and by increasing the nonlinearity of the used superconducting material (e.g. WSi), e.g., by different alloy concentration.

Although it is known in the art that travelling wave parametric amplifiers which exploit the non-linear kinetic inductance of a superconducting transmission line are promising candidates to deliver a high gain, a quantum limited noise performance over a wide bandwidth (several GHz) and a high dynamic range, their practical realization is hampered by fabrication defects, since typically ~1 m long transmission line is required to achieve substantial parametric gain. The inventors have shown that the TWPA device of the present invention can be fabricated using known technologies and is fully functional, and the inventors have succeeded amplifying signals repeatedly with four wave mixing with a short trace (less than 12 cm).

Figure 8:
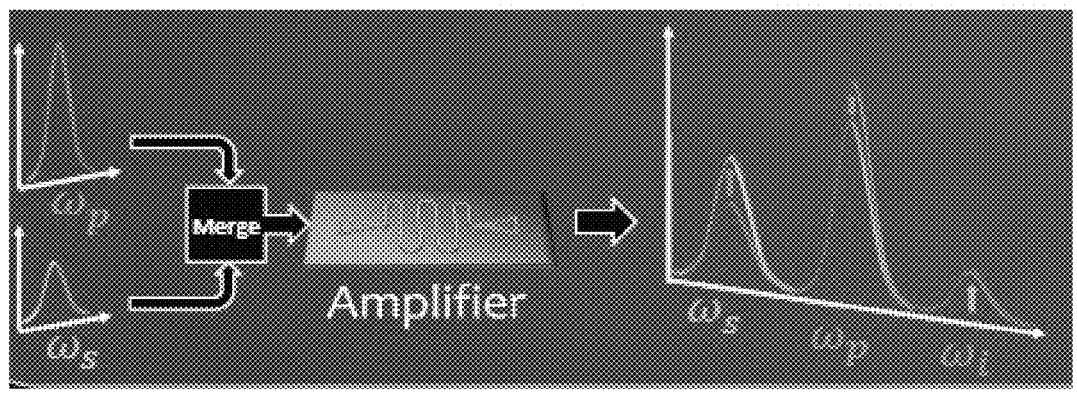
FIG. 8 shows how the TWPA of the present invention can be used in an electronic signal processing system, e.g. parametric four-wave mixing.

FIG. 8 schematically illustrates an example of an electronic system utilizing the TWPA of the present invention. As shown the TWPA has an input for receiving an electrical signal to be amplified $\omega_s$ combined/merged with a pump signal $\omega_p$. In this example, four-wave mixing is implemented. Although not specifically shown, the electronic system also includes an electronic circuit implementing a successive amplification stage including the respective elements shown in FIG. 2 above (switches, circulators, conventional amplifiers, etc.). The resulting/amplified current I consists of signal $I_s$, idler $I_i$, and pump $I_p$ tones and is determined by Eq. 3 above. Idler tone appears at $\omega_i=2\omega_p-\omega_s$ while energy is transferred from the strong pump at $\omega_p$ to the signal at $\omega_s$.

Figure 9A:
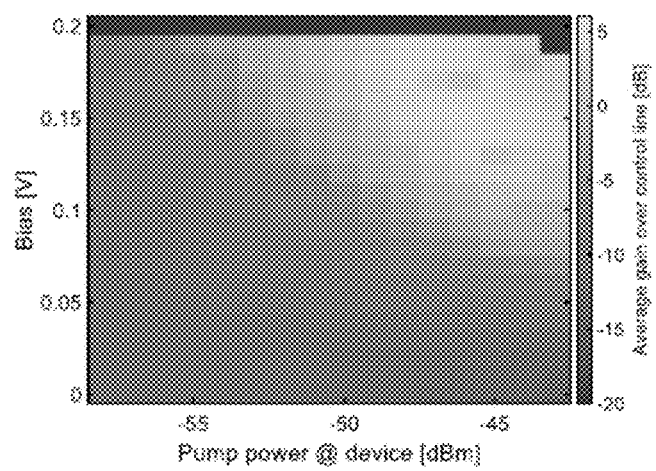
Figure 9B:
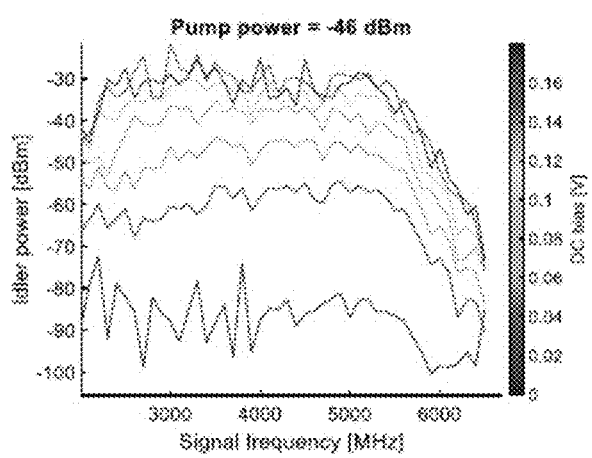
Figure 9C:
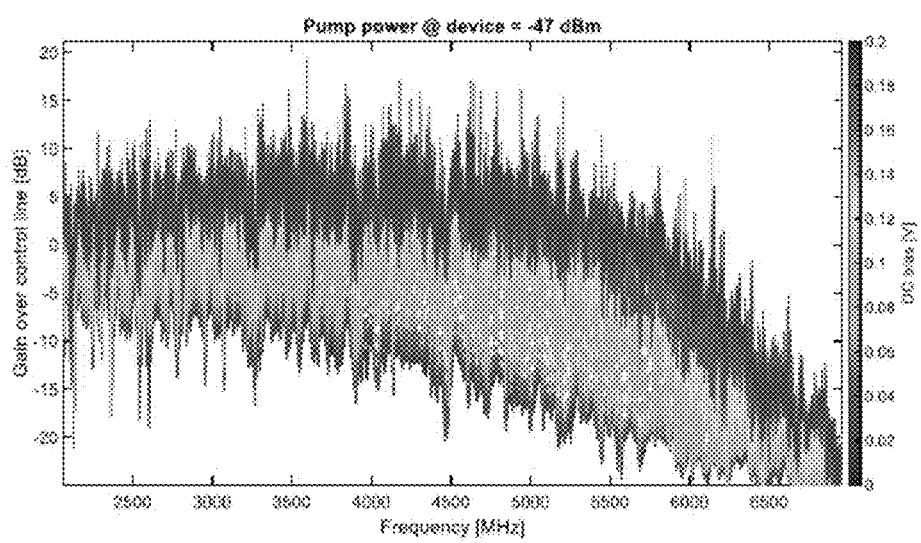

Also, the inventors have shown that three wave mixing was implemented successfully with the device of the invention, as shown in FIGS. 9A-9C. In three-wave mixing operation a bias current $I=I_p+I_{DC}$ is introduced so that the signal and idler mode frequencies satisfy the constraint: $\omega_p=\omega_s+\omega_i$. FIG. 9A shows the growth in the amplifier gain (output/input) when both the pump power and DC bias intensify. FIG. 9B proves the operation of the three-wave mixing mode showing that idler power is rising as a function of the bias current at constant pump power. FIG. 9C shows the gain of the amplifier as a function of frequency at constant pump power and with increasing DC bias. In FIGS. 9A and 9C the gain over control line is shown, obtained by measuring the gain of the amplifier as compared to a bare 50 Ohm transmission control line (without loss or gain).

Thus, the present invention provides impedance-matched, microstrip based TWPA device, which derives its nonlinearity from superconducting material composition (e.g. WSi) having highly power-dependent kinetic inductance. The amplifier according to the current invention operable with a wide bandwidth, large dynamic range, and a sub-Kelvin noise temperature, can be advantageously useful with superconducting circuit readout protocols, especially with minor improvements lowering the dielectric loss. It should be understood that the device of the present invention can be used in a variety of applications, not limited to pure amplification. The extraordinarily slow phase velocity $v_{ph}$ allows the integration of the TWPA device of the present invention or similar interferometric structures in superconducting quantum circuits, where the propagation bounds due to chip size.

The invention claimed is:

1. A traveling wave kinetic inductance parametric amplifier comprising: a microstrip structure defining a parallel plate capacitor element formed by first and second electrically conductive layers spaced by a dielectric spacer layer, the first electrically conductive layer being made of superconducting material composition having desirably high kinetic inductance and being configured as a nanoscale thickness strip, wherein said nanoscale thickness strip has a pattern of width variation along the strip.

2. The amplifier according to claim 1, wherein said capacitor element is configured with desirably high capacitance per unit length of said strip, thereby providing impedance of said microstrip structure matching 50 Ohm.

3. The amplifier according to claim 2, wherein said nanoscale thickness strip has kinetic inductance per unit length of the strip of at least 50 µH/m and said capacitor element is configured with capacitance per unit length of at least 20 nF/m, thereby providing impedance of said microstrip structure matching 50 Ohm.

4. The amplifier according to claim 1, wherein said microstrip is configured and operable as an electrical transmission line having a phase velocity substantially not exceeding 0.005c, c being speed of light in vacuum.

5. The amplifier according to claim 1, wherein said strip of the superconducting material composition is a few centimeters long.

6. The amplifier according to claim 5, wherein said strip of the superconducting material composition has a length substantially not exceeding 10 cm.

7. The amplifier according to claim 1, wherein said superconducting material composition comprises amorphous tungsten-silicide (WSi).

8. The amplifier according to claim 1, wherein said dielectric spacer layer is made of amorphous silicon.

9. The amplifier according to claim 1, wherein said second electrically conductive layer is made of aluminum.

10. The amplifier according to claim 1, wherein said dielectric spacer layer is thicker than a thickness of said strip of the superconductive material composition.

11. The amplifier according to claim 1, wherein said strip of the superconductive material composition has a width-thickness aspect ratio of an order of 1000.

12. The amplifier according to claim 11, wherein said strip of the superconductive material composition has a thickness of a few nanometers and has an average width of several microns along the strip with said pattern of strip width variation.

13. The amplifier according to claim 1, wherein said microstrip structure is configured and operable with a gain of at least 10 dB, thereby enabling to amplify essentially weak input data signals through non-linear interaction with a pump signal, said non-linear interaction being either one of three-wave mixing mode and four-wave mixing mode.

14. The amplifier according to claim 1, wherein said microstrip structure is configured and operable with a dynamic range of amplification of at least four orders of magnitude.

15. The amplifier according to claim 1, wherein said microstrip structure is configured and operable with an amplification gain bandwidth of 1 GHz.

16. A traveling wave kinetic inductance parametric amplifier comprising: a microstrip structure defining a capacitor element formed by first and second electrically conductive layers spaced by a dielectric spacer layer, the first electrically conductive layer being made of superconducting material composition having desirably high kinetic inductance and is configured as a nanoscale thickness strip having a pattern of strip width variation, said capacitor element being configured with desirably high capacitance per unit length of said strip providing impedance of said microstrip structure matching 50 Ohm.

17. A traveling wave kinetic inductance parametric amplifier comprising: a microstrip structure defining a capacitor element formed by first and second electrically conductive layers spaced by a dielectric spacer layer, the first electrically conductive layer being made of superconducting material composition having desirably high kinetic inductance and being configured as a nanoscale thickness strip having a pattern of width variation along the strip, and said capacitor element being configured with desirably high capacitance per unit length of said strip, thereby providing impedance of said microstrip structure matching 50 Ohm at a length of said strip substantially not exceeding 10 cm.

18. A traveling wave kinetic inductance parametric amplifier comprising: a microstrip structure defining a parallel plate capacitor element formed by first and second electrically conductive layers spaced by a dielectric spacer layer, the first electrically conductive layer being made of superconducting material composition of WSi having desirably high kinetic inductance and being configured as a nanoscale thickness strip having a pattern of width variation along the strip, and said dielectric spacer layer being a silicon layer.

19. A traveling wave kinetic inductance parametric amplifier comprising: a microstrip structure defining a parallel plate capacitor element formed by first and second electrically conductive layers spaced by a dielectric spacer layer, the first electrically conductive layer being made of superconducting material composition having desirably high kinetic inductance and being configured as a nanoscale thickness strip, wherein said microstrip structure is configured and operable with a gain of at least 10 dB, thereby enabling to amplify essentially weak input data signals through non-linear interaction with a pump signal, said non-linear interaction being either one of three-wave mixing mode and four-wave mixing mode.

20. A traveling wave kinetic inductance parametric amplifier comprising: a microstrip structure defining a parallel plate capacitor element formed by first and second electrically conductive layers spaced by a dielectric spacer layer, the first electrically conductive layer being made of superconducting material composition having desirably high kinetic inductance and being configured as a nanoscale thickness strip, wherein said microstrip structure is configured and operable with an amplification gain bandwidth of 1 GHz.

21. The amplifier according to claim 19, wherein said nanoscale thickness strip has a pattern of width variation along the strip.

* * * * *